United States Patent
Aoki et al.

(10) Patent No.: US 11,503,725 B2
(45) Date of Patent: Nov. 15, 2022

(54) DRIVER CIRCUIT DEVICE FOR DRIVING EXTERNAL DEVICE HAVING SEMICONDUCTOR ELEMENT

(71) Applicant: TAMURA CORPORATION, Tokyo (JP)

(72) Inventors: Hirotoshi Aoki, Saitama (JP); Kiyotaka Yoshida, Saitama (JP); Tomohiko Yoshino, Saitama (JP)

(73) Assignee: TAMURA CORPORATION, Tokyo (JP)

( * ) Notice: Subject to any disclaimer, the term of this patent is extended or adjusted under 35 U.S.C. 154(b) by 187 days.

(21) Appl. No.: 16/816,791

(22) Filed: Mar. 12, 2020

(65) Prior Publication Data
US 2020/0296845 A1 Sep. 17, 2020

(30) Foreign Application Priority Data
Mar. 14, 2019 (JP) .............................. JP2019-047696

(51) Int. Cl.
*H05K 5/00* (2006.01)
*H02M 1/08* (2006.01)
(Continued)

(52) U.S. Cl.
CPC ............ *H05K 5/0065* (2013.01); *H02M 1/08* (2013.01); *H03K 17/567* (2013.01);
(Continued)

(58) Field of Classification Search
CPC . H01L 23/147; H01L 21/52; H01L 23/49861; H01L 2021/60247;
(Continued)

(56) References Cited

U.S. PATENT DOCUMENTS

| 8,007,255 B2 * | 8/2011 | Hattori | H02K 11/33 |
| | | | 417/410.1 |
| 10,340,816 B2 | 7/2019 | Ushijima | |

(Continued)

FOREIGN PATENT DOCUMENTS

| JP | 2001-237368 A | 8/2001 |
| JP | 5477157 B2 | 4/2014 |

(Continued)

OTHER PUBLICATIONS

Extended European Search Report, dated Jul. 20, 2020 by the European Patent Office (EPO), in the counterpart European Patent Application No. 20161175.3.

(Continued)

*Primary Examiner* — James Wu
*Assistant Examiner* — Hung Q Dang
(74) *Attorney, Agent, or Firm* — Greenblum & Bernstein, P.L.C.

(57) ABSTRACT

A gate driver includes: driver boards mountable on an IGBT module which is a driving-target external device; gate driver circuits which are formed on the driver boards and each apply a drive signal generated using power and a signal which are externally input through an input connector, to semiconductor elements of the IGBT module; and an insulating surrounding member disposed to surround a peripheral edge of the input-side driver board.

10 Claims, 11 Drawing Sheets

(51) Int. Cl.
*H03K 17/567* (2006.01)
*H05K 5/02* (2006.01)
(52) U.S. Cl.
CPC ......... *H05K 5/0021* (2013.01); *H05K 5/0069* (2013.01); *H05K 5/0247* (2013.01)
(58) Field of Classification Search
CPC ............ H01L 2224/02122; H05K 7/10; H05K 2201/10; H05K 5/0065; H05K 5/0021; H05K 5/0069; H05K 5/0247; H02M 1/08; H03K 17/567
See application file for complete search history.

(56) References Cited

U.S. PATENT DOCUMENTS

| | | |
|---|---|---|
| 2009/0002956 A1 | 1/2009 | Suwa et al. |
| 2016/0079744 A1 | 3/2016 | Nagasawa et al. |

FOREIGN PATENT DOCUMENTS

| | | |
|---|---|---|
| JP | 6130959 B1 | 5/2017 |
| JP | 6170640 B1 | 7/2017 |
| WO | 2016/031052 A1 | 3/2016 |

OTHER PUBLICATIONS

First Office Action, dated Feb. 9, 2021, in counterpart Japanese Patent Application No. 2019-047696 (including English Language Machine Translation).

* cited by examiner

DRIVER CIRCUIT DEVICE FOR DRIVING EXTERNAL DEVICE HAVING SEMICONDUCTOR ELEMENT

BACKGROUND OF THE INVENTION

Field of the Invention

The present invention relates to a driver circuit device, particularly to a driver circuit device which drives an external device including a semiconductor element.

Description of the Related Art

In a module having a power semiconductor such as IGBT (Insulated Gate-Bipolar Transistor), the power semiconductor is driven using a specialized driver circuit.

The power semiconductor module has the following structure. Specifically, semiconductor chips and wiring patterns are mounted on an insulating substrate, and conductors including the wiring patterns are electrically insulated from one another by ceramic layers or insulating layers, and the whole module is packaged with a case to be also insulated from an external part.

On a package surface of the power semiconductor module, conductors such as external terminals for gate driving and main circuit terminals corresponding to collectors/emitters are greatly exposed. Therefore, the module terminals which are output-side elements when seen in terms of the relation with a gate driver or the like used in combination with the power semiconductor module need to be surely insulated also from input-side elements of the gate driver.

SUMMARY OF THE INVENTION

The present invention disclosed and claimed herein, in one aspect thereof, comprises a driver circuit device. The driver circuit device comprises a circuit board mountable on a driving-target external device, a driver circuit which is formed on the circuit board and applies, to the external device, a drive signal generated using power and a signal which are externally input, and an insulating surrounding member disposed to surround a peripheral edge of the circuit board.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

Embodiments of a driver circuit device will be hereinafter described with reference to the drawings. In the following embodiments, though a gate driver is taken as an example of the driver circuit device and an IGBT module is taken as an example of a driving-target external device, the external device and the gate driver of the embodiments are not limited to these examples, and the external device may be a different power semiconductor module and the gate driver may be in a packaged state.

Figure 1A:
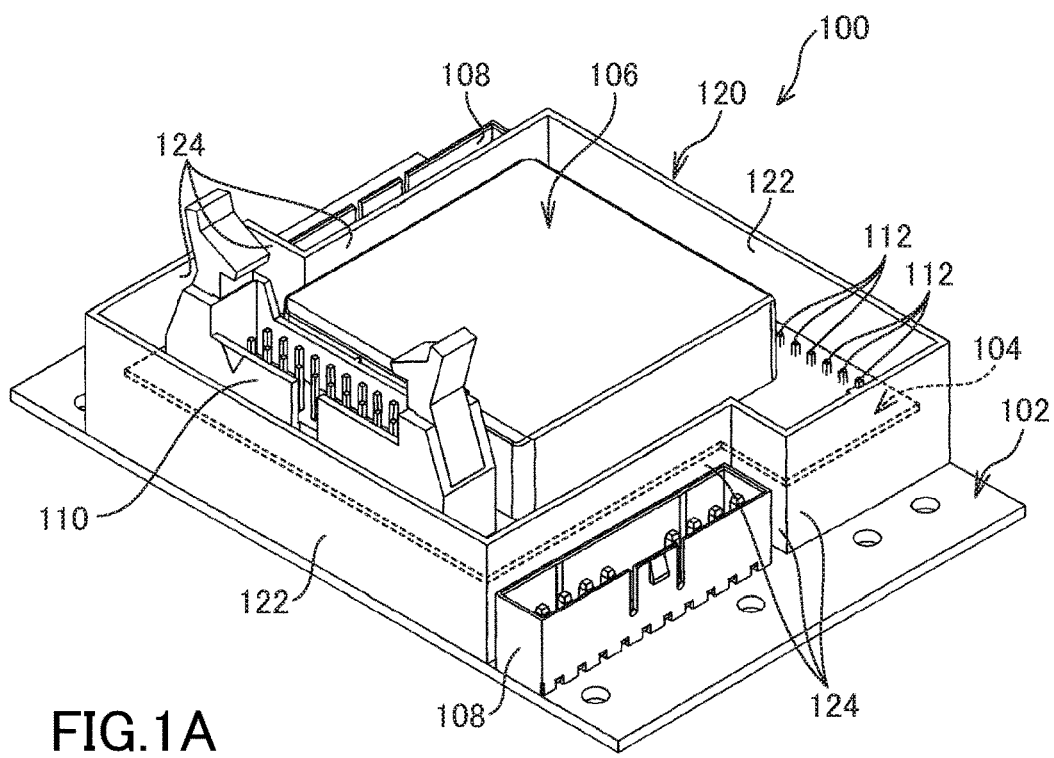
FIG. 1A and FIG. 1B are respectively a perspective view and a plan view illustrating the configuration of a gate driver of one embodiment.
Figure 1B:
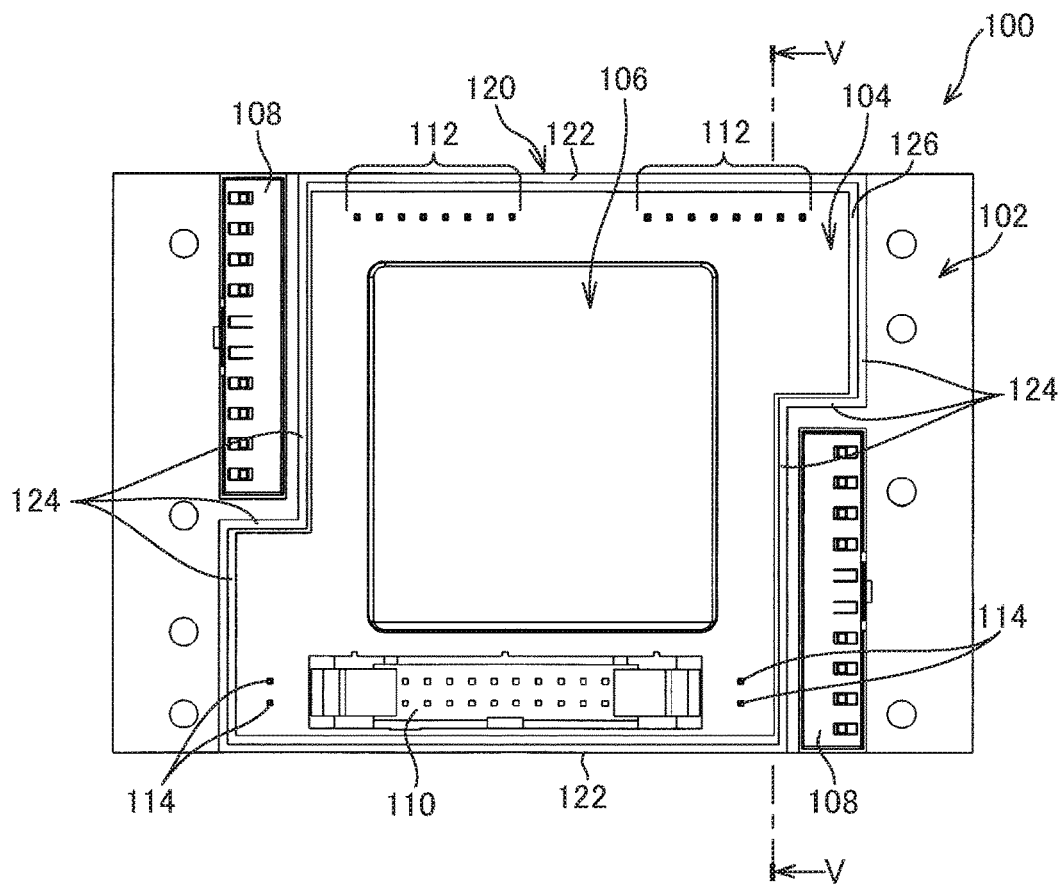

FIG. 1A is a perspective view illustrating the configuration of a gate driver 100 of one embodiment, and FIG. 1B is a plan view thereof. Further, FIG. 2 and FIG. 3 are exploded perspective views of the gate driver 100.

Figure 2:
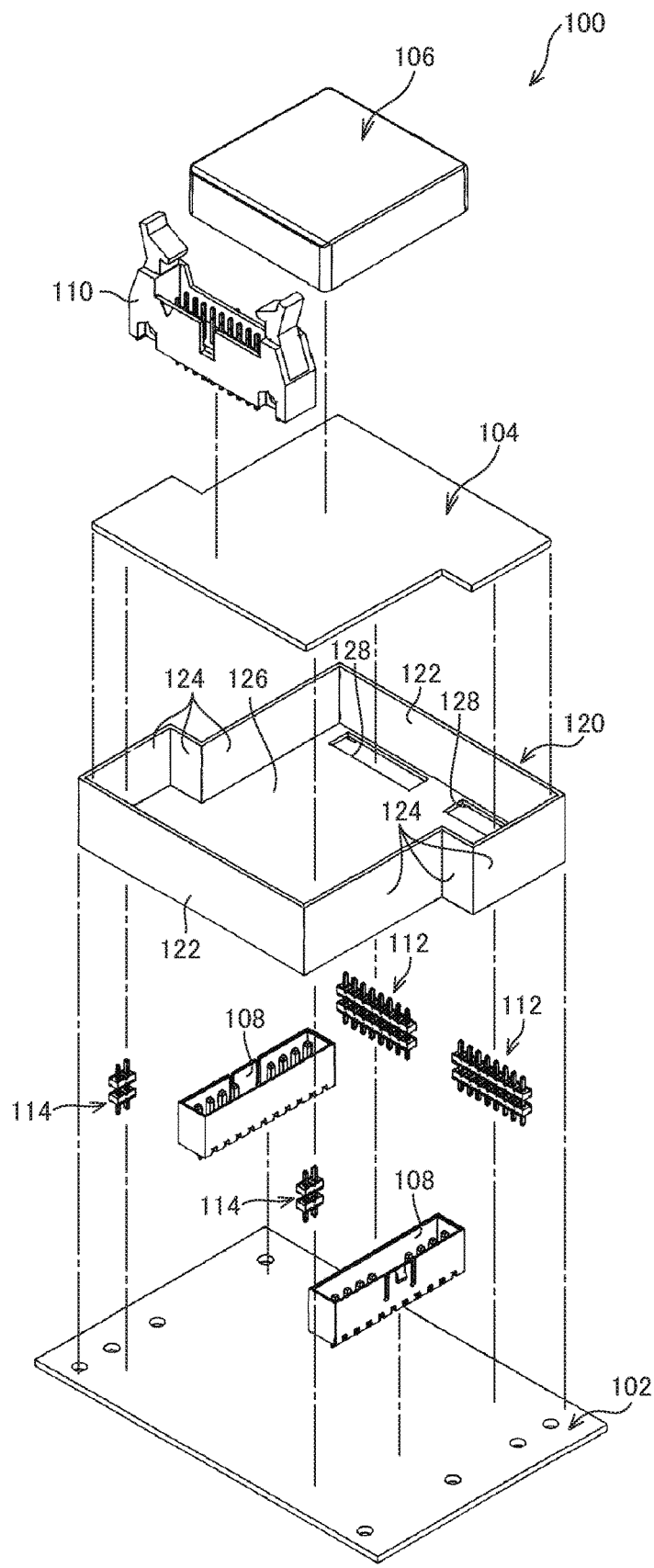
FIG. 2 is an exploded perspective view of the gate driver.
Figure 3:
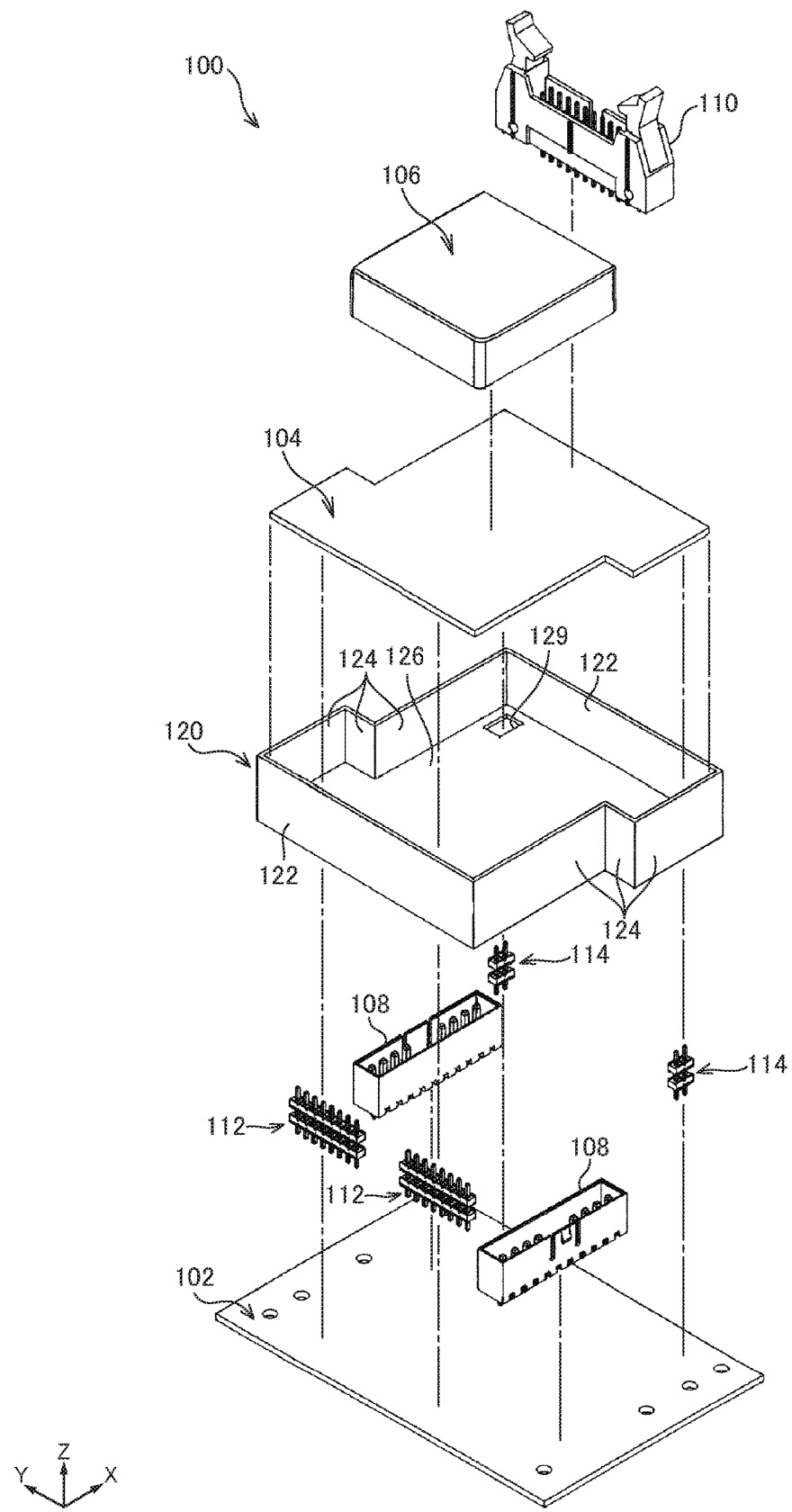
FIG. 3 is an exploded perspective view of the gate driver.

The gate driver 100 includes two driver boards 102, 104 which are disposed apart from each other in an up-down direction (Z-axis direction in FIG. 2 and FIG. 3). A not-illustrated gate driver circuit is formed on the driver boards 102, 104. Each of the driver boards 102, 104 itself also has a multilayer structure, and the two driver boards 102, 104 are stacked with their circuit surfaces facing each other. Further, a space is kept between the two driver boards 102, 104, which will be described in more detail with reference to other drawings.

On the driver board 104 (disposed on the upper side in FIG. 1A to FIG. 3), a DC-DC converter 106, an input connector 110, and various kinds of not-illustrated chip components are mounted, and besides, not-illustrated wiring patterns are formed. Wiring lines connecting to an external DC power source, a control unit, and so on, which are not illustrated, can be connected to the input connector 110. The DC-DC converter 106 converts an externally input DC power (for example, DC+12 V) into a drive current for the gate driver circuit. Note that the external power source may be an AC power source, and in this case, an AC-DC converter or the like can be mounted on the driver board 104.

The two driver boards 102, 104 are coupled with each other, with a plurality of lead pins 112 and support pins 114 therebetween, and out of these, arrays of the lead pins 112 electrically connect the driver boards 102, 104. Arrays of the support pins 114 structurally couple the two driver boards 102, 104. The arrays of the support pins 114 and the lead pins 112 keep the space between the two driver boards 102, 104.

The not-illustrated gate driver circuit is formed on the two driver boards 102, 104 as described above, and the gate driver circuit is divided into a plurality of systems according to the circuit configuration (semiconductor bridge) of a driving-target module. How the gate driver circuit drives the semiconductors will be further described in detail later.

The gate driver 100 further includes an insulating member 120 surrounding the driver board 104. The insulating member 120 is formed of, for example, an insulating resin, and its whole shape is like that of a casing covering a lower surface of the driver board 104 while surrounding a peripheral edge of the driver board 104.

In more detail, in the driver board 104, edge portions making a pair in one direction (X-axis direction in FIG. 2 and FIG. 3) are linear and edge portions making a pair in the other direction (Y-axis direction in FIG. 2 and FIG. 3) are cranked (bent). Accordingly, the insulating member 120 includes a pair of flat surface walls 122 and a pair of bent walls 124 each having a shape along the corresponding edge portion of the driver board 104. Such an insulating member 120 is disposed in a state of standing on the circuit surface of the other driver board 102.

The insulating member 120 further includes a flat plate-shaped division wall 126 in its region covering the lower surface of the driver board 104, and a peripheral edge of the division wall 126 is coupled with inner wall surfaces of the flat surface walls 122 and the bent walls 124. Further, the division wall 126 has openings 128, 129 formed at its appropriate positions, and the aforesaid arrays of the lead pins 112 and the support pins 114 are inserted to the openings 128, 129 respectively. Note that a lower surface, not illustrated in FIG. 2 and FIG. 3, of the division wall 126 is at a position slightly higher than lower ends of the flat surface walls 122 and the bent walls 124, ensuring that the division wall 126 and an upper circuit surface of the other driver board 102 are spaced.

On the other driver board 102 (disposed on the lower side in FIG. 1A and FIG. 1B), a pair of output connectors 108 is mounted and besides, not-illustrated various chip components are mounted. On the circuit surface, the output connectors 108 are disposed at positions outside the insulating member 120, that is, are separated from the driver board 104 by the insulating member 120. Because the edge portions of the driver board 104 and the bent walls 124 are cranked, mounting ranges of the output connectors 108 and an installation range of the insulating member 120 do not interfere with each other on the circuit surface. The use purpose of the output connectors 108 will be further described later.

Figure 4:
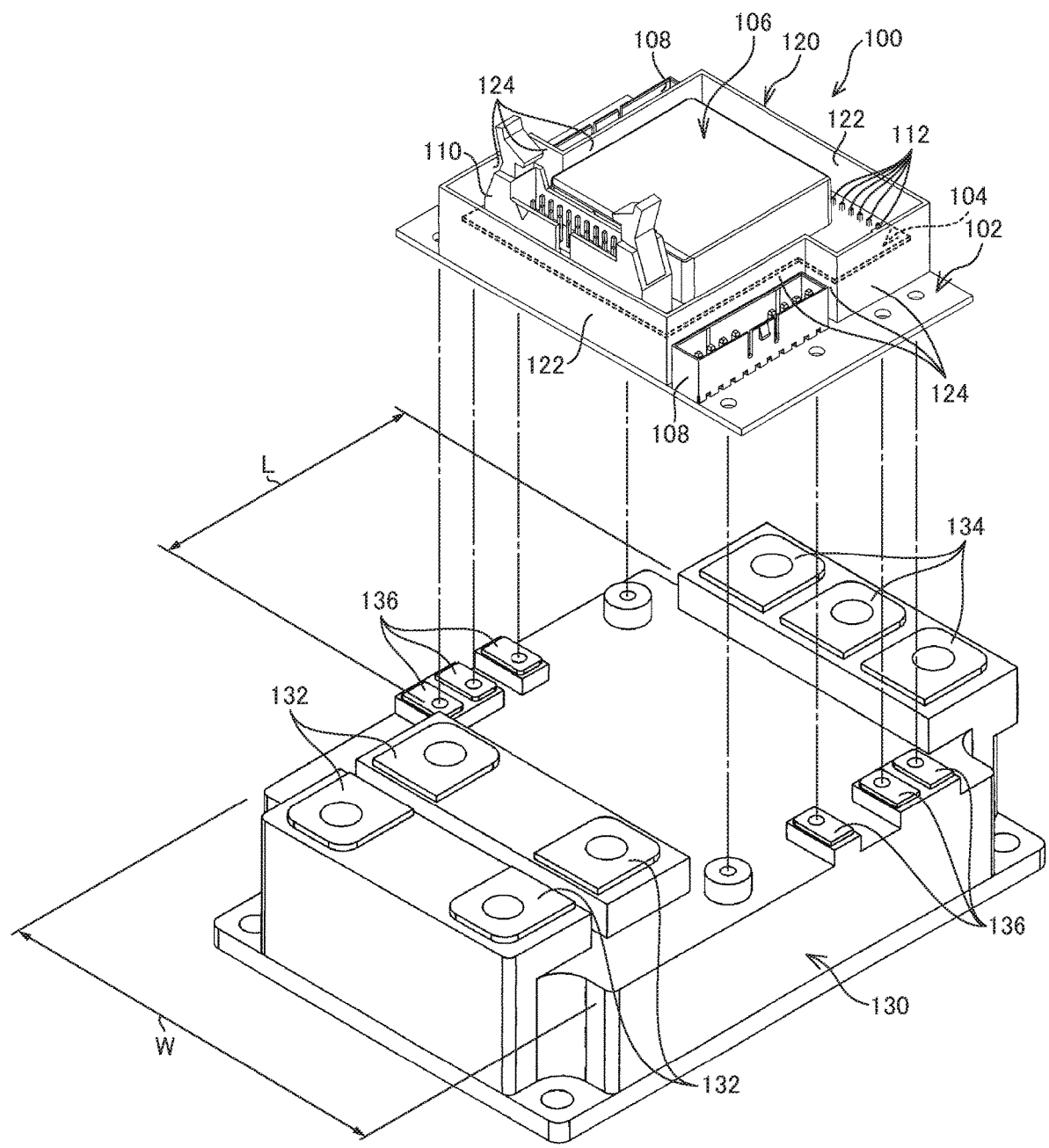
FIG. 4 is a separation perspective view illustrating a mounting example of the gate driver.

The gate driver 100 is capable of driving semiconductor elements (IGBT) in the state of being mounted on the driving-target IGBT module 130 as illustrated in FIG. 4. The IGBT module 130 is provided with various kinds of connection terminals 132, 134, 136, and the gate driver 100 is mounted thereon with lower surface terminals (not illustrated) of the driver board 102 press joined to the connection terminals 136, for instance. Further, main conductors (+ and −) such as busbars are connected to the connection terminals 132 which are located on one side of the IGBT module 130 in terms of the longitudinal detection and conductors for midpoint between the semiconductor elements are connected to the connection terminals 134 which are located on the other side.

On the IGBT module 130, a mounting region of the gate driver 100 is reserved in advance, and this mounting region is defined by a dimension L and a dimension W in the longitudinal direction and the width direction of the IGBT module 130 respectively, for instance. Accordingly, the gate driver 100 is structured such that the outside dimension of the driver board 102 falls within the mounting region (dimensions L, W).

Figure 5:
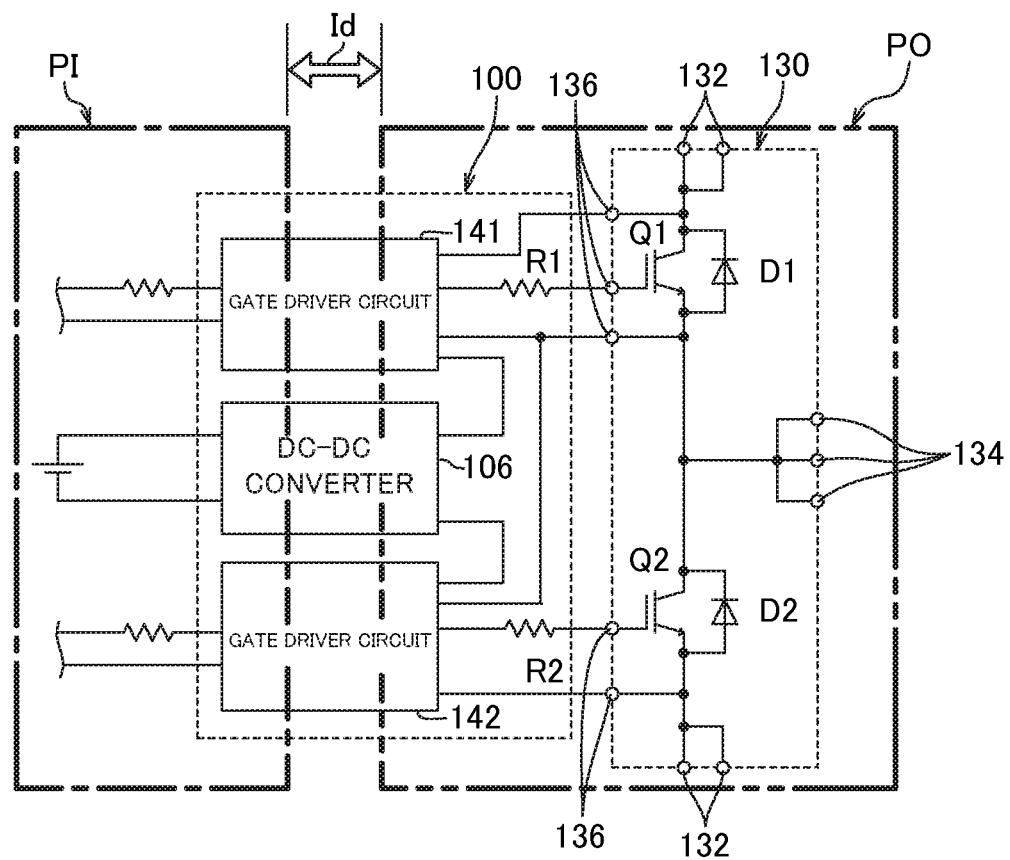
FIG. 5 is a circuit diagram illustrating the connection relation between the gate driver and an IGBT module.

FIG. 5 is a circuit diagram illustrating the connection relation between the gate driver 100 and the IGBT module 130. When mounted on the IGBT module 130 in the above-described manner, the gate driver 100 is electrically connected with the IGBT module 130 through the connection terminals 136.

The gate driver 100 includes two gate driver circuits 141, 142 corresponding to the semiconductor elements Q1, Q2 provided in the IGBT module 130 respectively, and the gate driver circuits 141, 142 apply gate drive signals to the semiconductor elements Q1, Q2 through resistors R1, R2 respectively. Note that, when seen from the gate driver 100, the whole IGBT module 130 can be considered as its driving-target external device or only a part corresponding to the semiconductor elements Q1, Q2 can be considered as its driving-target external device.

As described above, control signals are externally input to the gate driver circuits 141, 142 through the input connector 110 (not illustrated in FIG. 5), and besides, a DC current is also externally input (supplied) to the DC-DC converter 106. The drive current is supplied to the gate driver circuits 141, 142 from the DC-DC converter 106.

At this time, in the gate driver 100, an input-side (primary-side) circuit and an output-side (secondary-side) circuit are electrically insulated, and this input-side circuit PI includes the input connector 110, a not-illustrated primary-side circuit in the DC-DC converter 106, not-illustrated primary-side circuits in the gate driver circuits 141, 142, and their resistors, wiring patterns, connection terminals, and so on.

If the above part is defined as the input-side circuit PI, the whole IGBT module 130 is an output-side circuit PO when seen in the state where the gate driver 100 is mounted thereon, and the output-side circuit PO at this time includes a not-illustrated secondary-side circuit in the DC-DC converter 106, not illustrated secondary-side circuits in the gate driver circuits 141, 142, and their resistors R1, R2, wiring patterns, connection terminals, and so on which are all insulated from the input-side circuit PI.

Therefore, an appropriate insulation distance Id needs to be kept between the input-side circuit PI and the output-side circuit PO, but there are various structural restrictions in keeping the insulation distance Id because the gate driver 100 is structured to be mounted on the package surface of the IGBT module 130 as described above and the gate driver 100 itself needs to be as compact as possible to be reduced in its mounting height and mounting area.

The aforesaid structural restrictions would oblige a person with an ordinary skill in the art to provide a large spatial distance between the gate driver 100 and the IGBT module 130 or make the mounting height of the gate driver 100 itself large to thereby keep the insulation distance Id. On the other hand, the inventors have succeeded in reducing a physical spatial distance between the input-side circuit PI and the output-side circuit PO by suitably disposing the insulating member 120. How the insulation distance Id is kept (the spatial distance is reduced) in the mounted state will be described below.

Figure 6:
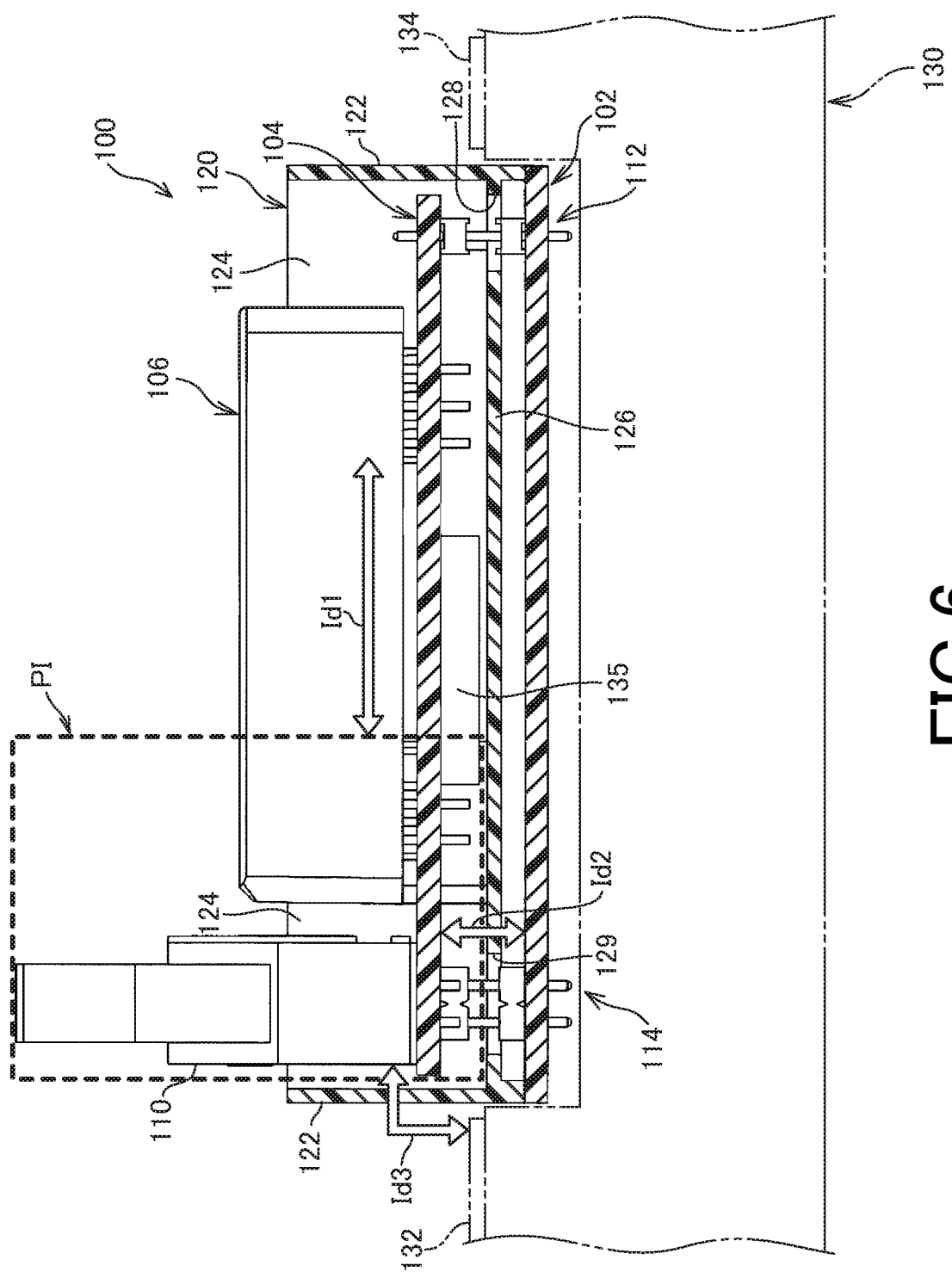
FIG. 6 is a vertical sectional view (sectional view along the V-V line in FIG. 1B) of the gate driver.
Figure 7:
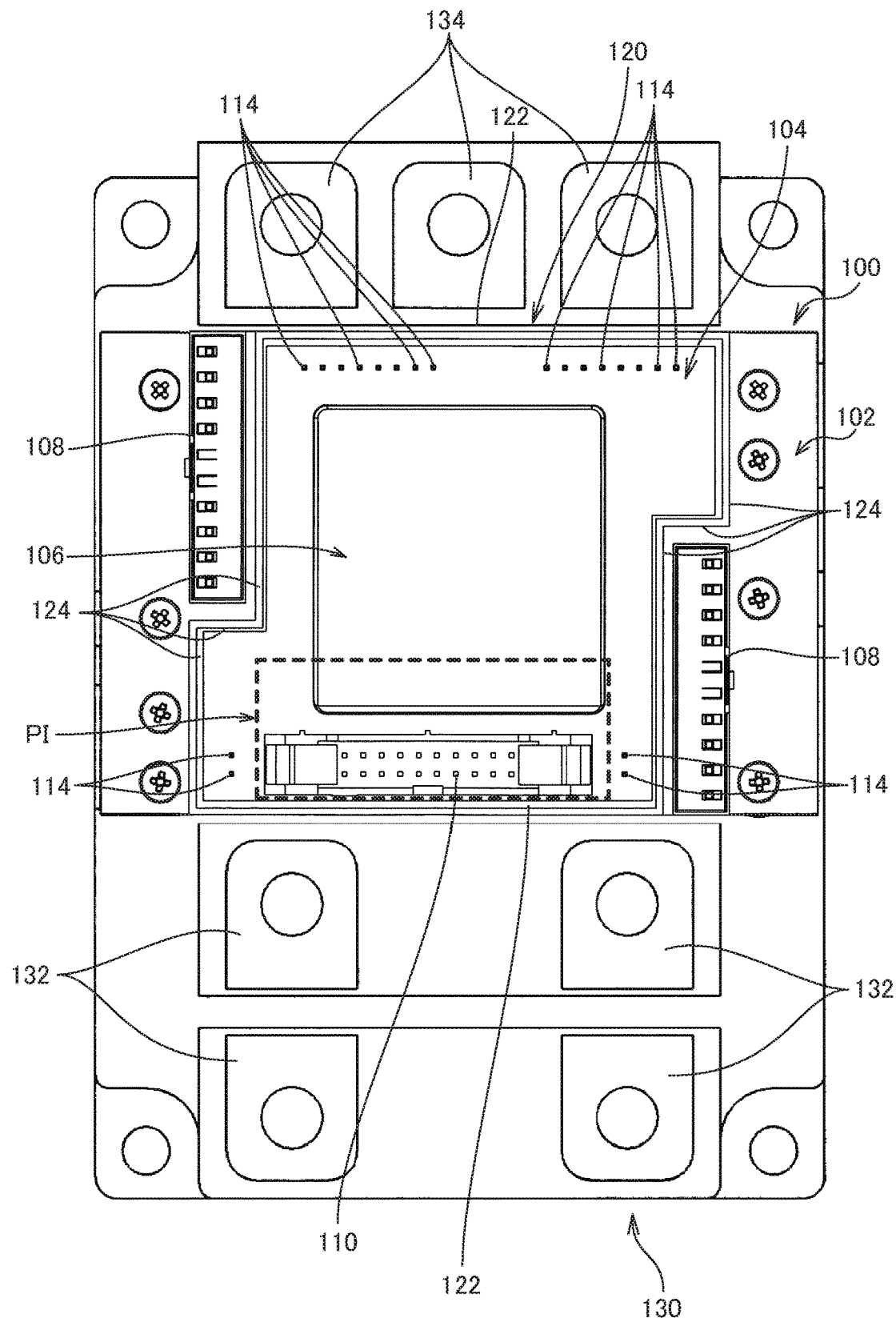
FIG. 7 is a plan view illustrating a state where the gate driver is mounted on the IGBT module.

From here, FIG. 6 and FIG. 7 will be referred to. In FIG. 6, the IGBT module 130 which is a mounting destination is indicated by the two-dot chain line.

As described above, the input-side circuit PI includes the input connector 110, the primary-side circuit of the DC-DC converter 106, the primary-side circuits in the gate driver circuits 141, 142 (not illustrated in FIG. 5 and FIG. 6), and so on, and they are structurally disposed in the range indicated by the bold broken line in FIG. 6 and FIG. 7. Note that an insulating element 135 is mounted on the driver board 104, and the dimension (standard dimension) of the insulating element 135 itself provides an insulation distance Id1 (requirement according to the standard: about 14 mm) in the driver board 104.

In the gate driver 100 as well, since a region outside the range of the input-side circuit PI is included in the output-side circuit PO, the lower driver board 102 has to be disposed with a sufficient insulation distance from the input-side circuit PI. If it is attempted to have this insulation distance by providing a physical spatial distance, the distance needs to be about equal to the insulation distance Id1 indicated in FIG. 5, necessitating disposing the two driver boards 102, 104 more apart from each other than in the illustrated state. However, disposing the two driver boards 102, 104 with such a spatial distance therebetween causes another problem of extremely increasing the mounting height of the whole gate driver 100.

Therefore, in this embodiment, the insulating division wall 126 partitions the gap (space) between the two driver boards 102, 104 to keep a necessary insulation distance Id2 while making the physical spatial distance therebetween smaller (smaller than the insulation distance Id1). Specifically, the presence of the division wall 126 between the input-side circuit PI and the circuit surface of the driver board 102 improves insulation performance, accordingly allowing a reduction in the physical spatial distance therebetween. This can make the mounting height of the whole gate driver 100 low to contribute to downsizing.

As for the relation between the gate driver 100 and the IGBT module 130, considering that the connection terminals 132 are at positions near the input-side circuit PI when the gate driver 100 is in the mounted state and also considering that the busbars are connected to the connection terminals 132, the input-side circuit PI and the connection terminals 132 (busbars in the connected state) should have an appropriate spatial distance therebetween. In this case, if it is attempted to mount the gate driver 100 within the predetermined mounting region, the driver board 104 has to be disposed more apart in the height direction than in the illustrate state. However, disposing the driver board 104 at such a height also causes the problem of extremely increasing the mounting height of the whole gate driver 100. Note that it is difficult to dispose the input-side circuit PI closer to the middle of the driver board 104 because of the limited board area, but disposing the input-side circuit PI on the opposite side causes another problem that its insulation distance cannot be kept from the other connection terminals 134.

Therefore, in this embodiment, the insulating member 120 is disposed around the peripheral edge of the driver board 104 on which the input-side circuit PI is mounted, to surround the driver board 104 by the flat surface walls 122 and the bent walls 124, thereby keeping a sufficient insulation distance Id3 between the input-side circuit PI and the output-side circuit PO in the IGBT module 130 while making the physical spatial distance therebetween small (smaller than the insulation distance Id1).

That is, in the example in FIG. 6, the presence of the flat surface wall 122 between the input-side circuit PI and the connection terminals 132 (or the busbars in the connected state) of the IGBT module 130 improves insulation performance, accordingly allowing to dispose them close to each other with a reduced physical spatial distance. This can make the mounting height of the whole gate driver 100 low to contribute to downsizing.

Further, in the example in FIG. 7, the periphery (three directions) of the input-side circuit PI is surrounded by the flat surface wall 122 and the bent walls 124. This allows the output connectors 108 to be disposed near the input-side circuit PI, making it possible to effectively use the limited mounting area on the driver board 102 to increase the packaging density.

The gate driver 100 of this embodiment is capable of not only driving the semiconductor elements by outputting (applying) the drive signals to the IGBT module 130 which is its mounting destination, but also driving the plurality of IGBT modules 130, 131, 133 in parallel by outputting (applying) the drive signals in parallel also to the other IGBT modules 131, 133 that are not its mounting destination. The parallel driving will be described below.

Figure 8:
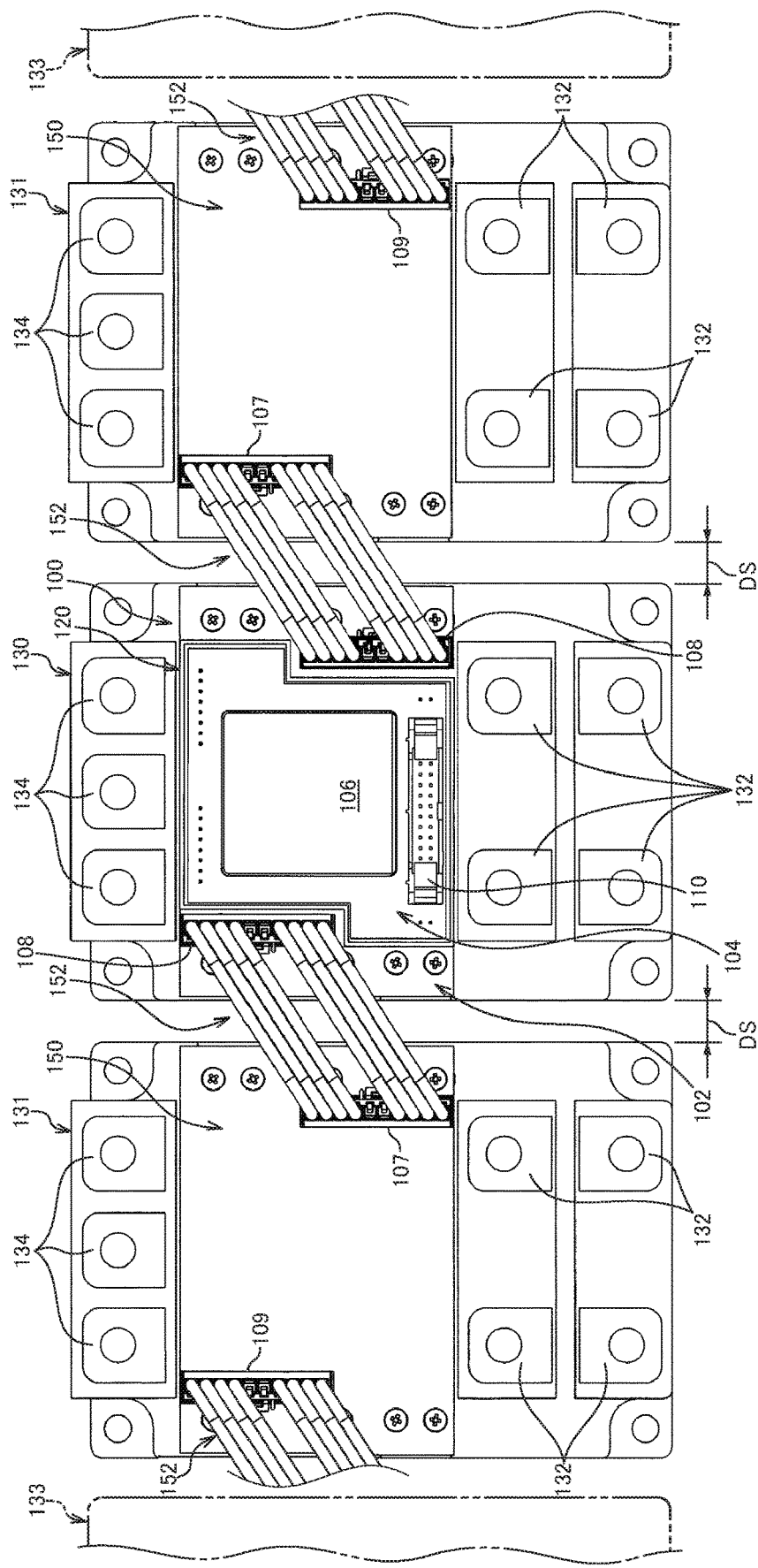
FIG. 8 is a plan view illustrating a coupling state of a plurality of IGBT modules.

FIG. 8 illustrates a coupling state of the plurality of IGBT modules 130, 131, 133.

First, the coupling relation between the IGBT module 130 and the other two IGBT modules 131 will be described. The two IGBT modules 131 are disposed on both sides one per side, across the IGBT module 130 on which the gate driver 100 is mounted. Further, a relay substrate 150 is mounted on each of the IGBT modules 131, and on each of the relay substrates 150, relay connectors 107, 109 and not-illustrated chip components (driving resistors) are mounted, and besides, wiring patterns for relaying are formed. Note that not-illustrated relay terminals are arranged on the relay connectors 107, 109, and the relay substrates 150 each have a circuit (not illustrated) that applies the drive signals which are input through the relay terminals, to the IGBT module 131 on which it is mounted.

On the output connectors 108 of the gate driver 100, external output terminals (parallel drive terminals) capable of externally outputting the drive signals from the gate driver circuits 141, 142 are arranged, and connecting the output connectors 108 and the relay connectors 107 of the relay substrates 150 by relay wiring lines 152 establishes the connection relation between the gate driver 100 and the relay substrates 150. In this manner, the IGBT module 130 is coupled with the IGBT modules 131 provided on both sides one per side.

Further, in this embodiment, still another IGBT module 133 can be coupled, and in this case, the other IGBT module 133 can be coupled with each of the IGBT modules 131 coupled to both sides of the IGBT module 130 one per side.

That is, the other IGBT modules 133 (indicated by the two-dot chain lines in FIG. 8) are disposed adjacently to the IGBT modules 131 provided on both sides one per side, whose connection relation is previously illustrated. At this time, on each of the other IGBT modules 133, the same relay substrate 150 as that described above is mounted, and the IGBT modules 131 provided on both sides one per side can be connected to the IGBT modules 133 adjacent thereto by relay wiring lines 152. For the connection of the relay wiring lines 152, the relay connectors 107, 109 of the adjacent relay substrates 150 are used. For example, the relay wiring lines 152 extending from the relay connectors 109 of the relay substrates 150 mounted on the IGBT modules 131 provided on both sides one per side (these relay wiring lines 152 are illustrated with part thereof being cut in FIG. 8) are connected to the relay connectors 107 of the relay substrates 150 mounted on the other IGBT modules 133 adjacent thereto.

Figure 9:
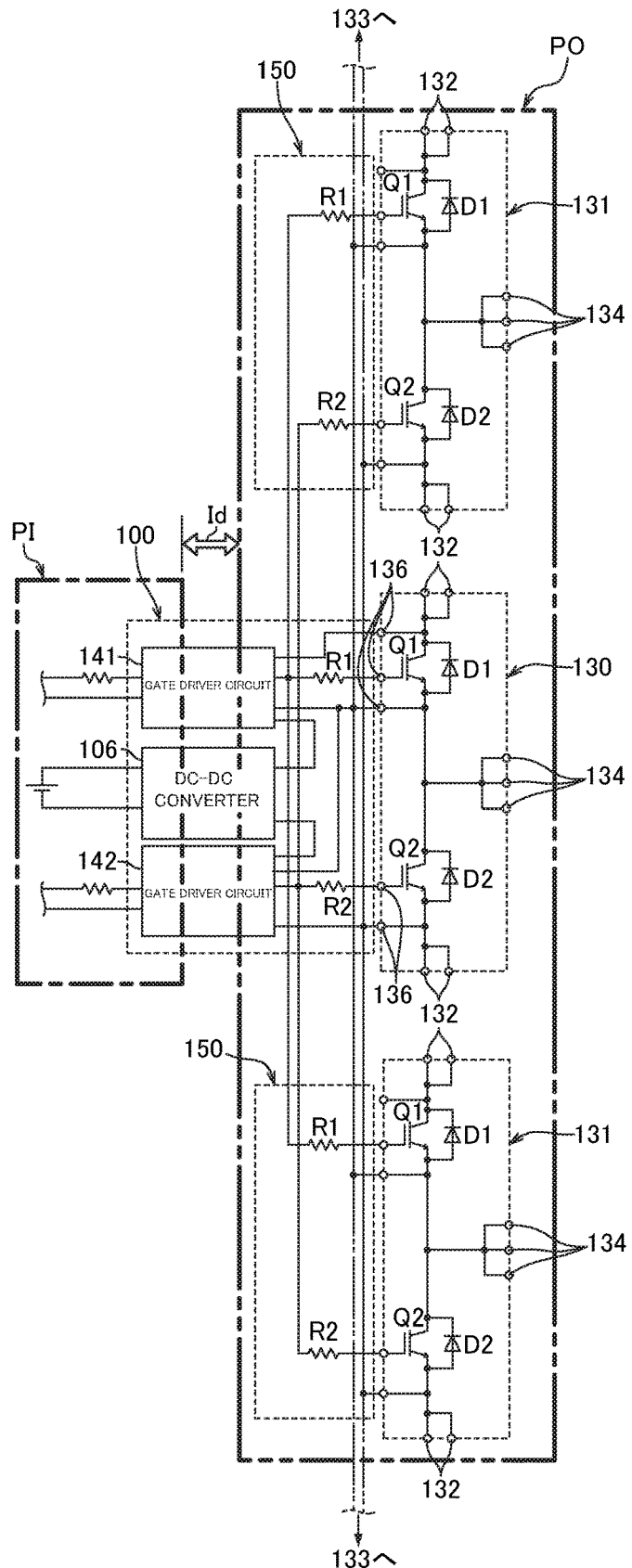
FIG. 9 is a diagram illustrating a circuit configuration in which the plurality of IGBT modules are coupled.

FIG. 9 illustrates a circuit configuration in which the plurality of IGBT modules 130, 131 (133) are coupled.

As described above, the IGBT modules 131 provided on both sides one per side are coupled across the IGBT module 130 on which the gate driver 100 of this embodiment is mounted. In this case, since the IGBT modules 131 have the relay substrates 150 mounted thereon, the drive signals output from the gate driver circuits 141, 142 of the gate driver 100 can be applied also to semiconductor elements Q1, Q2 of the IGBT modules 131 provided on both sides one per side.

Parallel Driving Example 1

Consequently, by externally outputting the drive signals to the relay terminals of the relay connectors 107 through the relay wiring lines 152 from the external output terminals of the output connectors 108, the gate driver circuits 141, 142 of the gate driver 100 are capable of driving in parallel not only the semiconductor elements Q1, Q2 of the middle IGBT module 130 but also the semiconductor elements Q1, Q2 of the IGBT modules 131 provided on both sides one per side, by using the drive signals.

Parallel Driving Example 2

Further, if the other IGBT module 133 is disposed adjacently to each of the IGBT modules 131 provided on both sides one per side and the aforesaid connection therebetween is established by the relay wiring lines 152, the drive signals externally output from the gate driver circuits 141, 142 are applied in parallel to the plurality of IGBT modules 130, 131, 133. Consequently, the gate driver circuits 141, 142 are capable of driving in parallel not only the semiconductor elements Q1, Q2 of the middle IGBT module 130 and the IGBT modules 131 provided on both sides one per side but also semiconductor elements Q1, Q2 of the other IGBT modules 133 adjacent to the IGBT modules 131 respectively. It should be noted that the number of the coupled IGBT modules 133 is not limited to one and still other IGBT modules 133 may be coupled in a row (any number of them can be coupled as long as the drive signals are kept at a level equal to or higher than a threshold value even in the attenuated state).

Further, in the state where the plurality of IGBT modules 130, 131 (133) are coupled as illustrated in FIG. 9, the other IGBT modules 131 (133) are included in the output-side circuit PO, and in this case as well, it is apparent that they have a sufficient insulation distance Id from the input-side circuit PI.

Figure 10A:
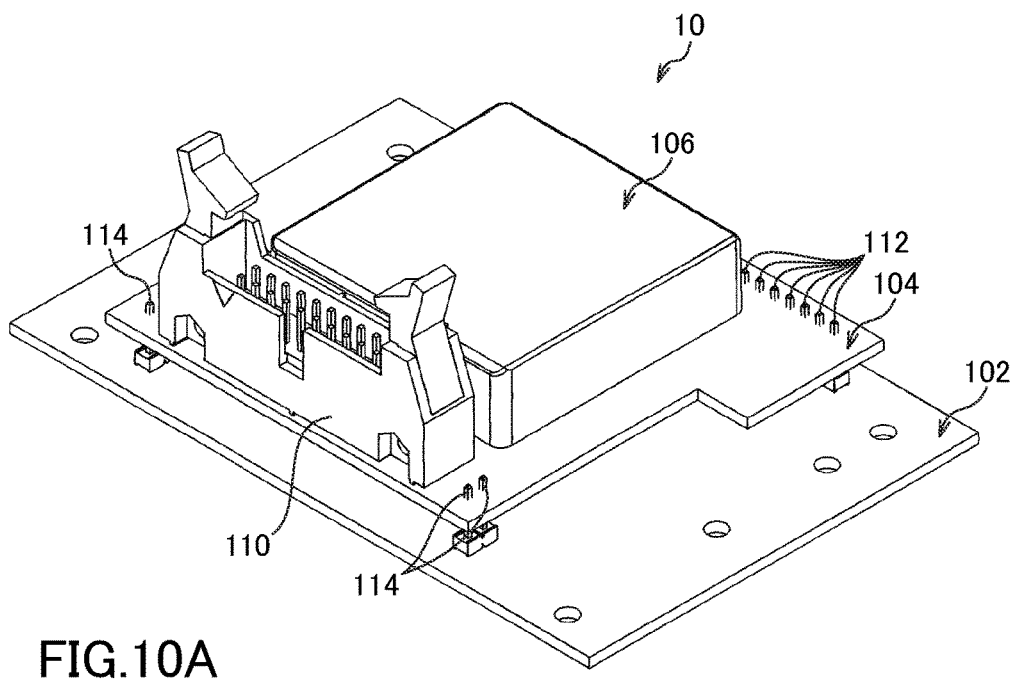
FIG. 10A and FIG. 10B are respectively a perspective view and a side view illustrating the configuration of a gate driver of a reference example.
Figure 10B:
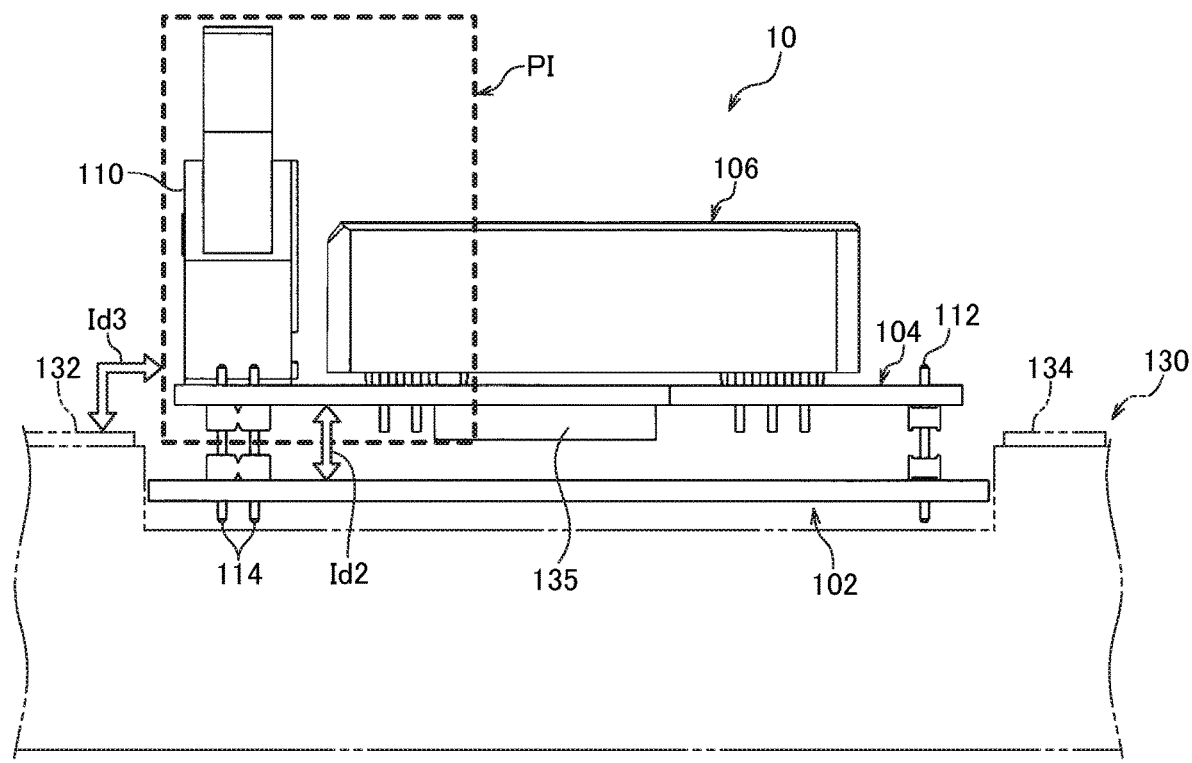

Here, the applicability of this embodiment will be described using a reference example for comparison. FIG. 10A and FIG. 10B illustrate a certain reference example. Note that this reference example is not a prior art.

A gate driver 10 of the reference example does not include the insulating member 120 used in this embodiment. Accordingly, a peripheral edge of a driver board 104 is open, and it is seen that a gap between the driver boards 102, 104 is not partitioned, either.

Such a gate driver 10 of the reference example does not satisfy the standard (standard requirement) as an actual product because the driver board 104 including an input-side circuit PI is close to the other driver board 102 without a spatial distance satisfying the standard level therebetween and an insulation distance Id2 is not enough. Similarly, in terms of the relation with an IGBT module 130 on which it is mounted, an insulation distance Id3 between the input-side circuit PI and connection terminals 132 is not enough, either.

Therefore, to increase the insulation distances Id2, Id3 to sufficient levels in the gate driver 10 of the reference example, the driver board 104 needs to be moved so as to be disposed at a height apart from the other driver board 102 by the spatial distance satisfying the standard requirement, leading to an increase in the mounting height (volume) of the whole gate driver 10.

In this respect, the gate driver 100 of this embodiment is far superior in that the whole size can be reduced with its mounting height reduced to the minimum owing to the sufficient insulation distances Id2, Id3.

The gate driver 100 of this embodiment brings about the following advantages.

(1) It is possible to keep the sufficient insulation distances Id2, Id3 between the input-side circuit PI and the output-side circuit PO, yet shorten the physical spatial distance therebetween to reduce the mounting height (volume).

(2) Further, even in the case where the mounting region is prescribed on the IGBT module 130 which is the driving target (mounting destination), it is possible to obtain the circuit configuration with sufficient performance by making the best use of the limited mounting region.

(3) The gate driver 100 has such a size as not to protrude to the outside of the IGBT module 130 in a plan view. Accordingly, even when the plurality of modules are coupled as illustrated in FIG. 8, it is possible to narrow an arrangement interval between the IGBT modules 130, 131 to the minimum, enabling improved space efficiency.

(4) The insulating member 120 is structured to have the flat surface walls 122, the bent walls 124, and the division wall 126 and they each have a unique insulation function, but since they are all integrally formed, it is possible to achieve easiness at the time of the manufacture and assembly, reduce production cost, and improve production efficiency.

(5) Further, the insulating member 120 is disposed only at a place where the insulation distance is necessary and does not package the whole including the driver board 104 and its mounted components, enabling a reduction in the number of used materials and weight, a reduction in production cost, and an increase in production efficiency.

(6) Since the insulating member 120 and the driver board 104 do not interfere with the mounting ranges of the output connectors 108 which are used when the plurality of IGBT modules 130, 131 are coupled, it is possible to effectively place the necessary mounted components within the limited board area and also to improve the packaging density.

Figure 11:
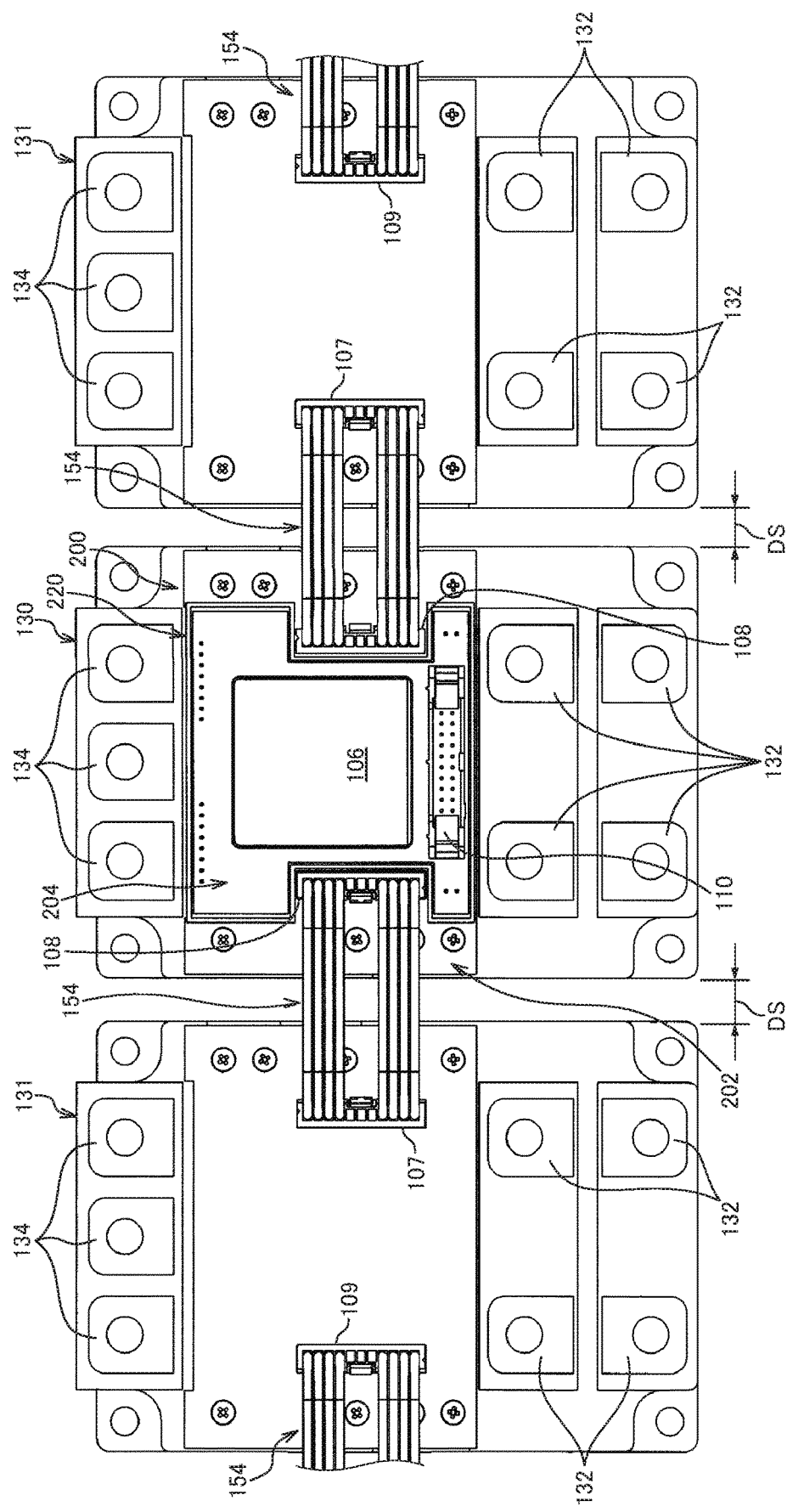
FIG. 11 is a plan view illustrating an example in which a gate driver of another embodiment is used.

FIG. 11 illustrates an example in which a gate driver 200 of another embodiment is used. The gate driver 200 of the other embodiment is different from the gate driver 100 of the above embodiment in that the shape of the periphery of one driver board 204 is different from that of the driver board 104 and accordingly the shape of an insulating member 220 is also different.

Specifically, the driver board 204 has a deformed H shape in a plan view, and output connectors 108 are arranged in the same direction as a coupling direction (lateral direction) of IGBT modules 130, 131. Further, regarding relay substrates 150 mounted on the IGBT modules 131 provided on both sides one per side, relay connectors 107, 109 are also arranged in the same direction as the coupling direction of the IGBT modules 130, 131. Note that other IGBT modules 133 may be coupled as in FIG. 8, though the IGBT modules 133 are not illustrated in FIG. 11.

The example in which such a gate driver 200 of the other embodiment is used additionally has an advantage that it is possible to minimize the length of relay wiring lines 154 between the coupled IGBT modules 130, 131 to further reduce the weight and material cost. This effect is larger as the number of the coupled IGBT modules 130, 131 (133) is larger.

Further, in the embodiments, the description is given using the example in which the gate driver 100 (200) has the two driver boards 102, 104 (202, 204), but the number of the driver boards may be three or more, and in this case, the division wall 126 can be disposed in each of the gaps (two places or more) between the facing circuit surfaces of the driver boards, and the plurality of division walls 126 may be integrally formed as the insulating member 120. Further, a structure with only one driver board may be adopted, and in this case, the peripheral edge of the single driver board is surrounded with the insulating member 120, and the division wall covering its lower surface need not be provided.

The insulating member 120 is not limited to one including the flat surface walls 122, the bent walls 124, and the division wall 126 but may be constituted by an annular peripheral wall and a disk-shaped division wall, for instance. Further, the thickness, material, shape of each portion of the insulating member 120 are not limited to those exemplified in the embodiment, and the insulating member 120 can be variously modified as long as it enables to reduce the spatial distance and keep the necessary insulation distance.

The output connectors 108 may be disposed, for example, at positions further lower than the position in the other embodiment in FIG. 11 to be disposed on both sides of the input connectors 110. In this case, the driver board 104 and the insulating member 120 each can have a T-shape in a plan view.

Further, in the plan view of FIG. 8, the output connectors 108 are mounted on both edge portions of the driver board 102, but instead, the two may be serially mounted on one edge portion of the driver board 102 or only one is mounted on one edge portion thereof. Further, the driver board 104 may have a rectangular shape in a plan view.

The examples in FIG. 8 and FIG. 11 show the form in which the other IGBT modules 131, 133, and so on are coupled to both sides of the IGBT module 130, but a form in which they are coupled only to one side may be adopted. Further, the number of the other coupled IGBT modules 131, 133 is not limited to the illustrated number, and in the case where they are coupled to both sides, their number may be different between both sides.

Besides, the structures described with the illustration in the embodiments and the application examples are only suitable examples, and various elements may be added to the basic structures or the basic structures may be partly replaced.

What is claimed is:

1. A driver circuit device, comprising:
    a circuit board mountable on a driving-target external device;
    a driver circuit that is formed on the circuit board and includes an input-side circuit and an output-side circuit insulated from the input-side circuit, the output-side circuit being in connection with an output-side circuit present in the external device in a state in which the circuit board is mounted on the external device, and the driver circuit being configured to output, from the own output-side circuit, a drive signal generated using power and a signal that are externally inputted to the input-side circuit, to apply the drive signal to the output-side circuit present in the external device; and
    an insulating surrounding member disposed to surround a peripheral edge of the circuit board, thereby keeping an insulation distance between the input-side circuit and the output-side circuit present in the external device.

2. The driver circuit device according to claim 1, further comprising:
    a parallel drive terminal, which is disposed on the circuit board, externally outputting the drive signal in parallel to another external device disposed in addition to the external device on which the driver circuit device is mounted,
    wherein, in a state where a relay substrate having a circuit which applies, to the other external device, the drive signal input through a predetermined relay terminal is mounted on the other external device, the driver circuit driving the other external device in parallel by using the drive signal that the driver circuit externally outputs from the parallel drive terminal to the relay terminal through a wiring line.

3. The driver circuit device according to claim 2,
    wherein another relay terminal is disposed on the relay substrate, the other relay terminal externally outputting the drive signal to still another external device in parallel while applying the drive signal to the other external device on which the relay substrate is mounted, and
    wherein, in a state where the relay substrate is mounted on each of a first external device and a second external device, which are the other external devices, the parallel drive terminal is connected, by a wiring line, to the relay terminal of the relay substrate mounted on the first external device, and the relay terminals of the first external device and the second external device are connected to each other by a wiring line,
    the driver circuit driving the first external device and the second external device in parallel by using the drive signal that the driver circuit externally outputs from the parallel drive terminal.

4. A driver circuit device, comprising:
    a plurality of circuit boards mountable on a driving-target external device while a space is kept between facing circuit surfaces of the plurality of circuit boards;
    a driver circuit that is formed on the plurality of circuit boards and includes an input-side circuit and an output-side circuit insulated from the input-side circuit, the output-side circuit being in connection with an output-side circuit present in the external device in a state in which the plurality of circuit boards are mounted on the external device, and the driver circuit being configured to output, from the own output-side circuit, a drive signal generated using power and a signal that are externally inputted to the input-side circuit, to apply the drive signal to the output-side circuit present in the external device; and
    an insulating surrounding member disposed to surround a peripheral edge of a specific circuit board, out of the plurality of circuit boards, on which the input-side circuit is formed, thereby keeping an insulation distance between the input-side circuit and the output-side circuit present in the external device.

5. The driver circuit device according to claim 4, further comprising:
    a parallel drive terminal, which is disposed on the circuit board, externally outputting the drive signal in parallel to another external device disposed in addition to the external device on which the driver circuit device is mounted,
    wherein, in a state where a relay substrate having a circuit which applies, to the other external device, the drive signal input through a predetermined relay terminal is mounted on the other external device, the driver circuit driving the other external device in parallel by using the drive signa that the driver circuit externally outputs from the parallel drive terminal to the relay terminal through a wiring line.

6. The driver circuit device according to claim 4, further comprising:
an insulating partition member disposed in the space to partition a gap between the circuit surfaces.

7. The driver circuit device according to claim 5,
wherein another relay terminal is disposed on the relay substrate, the other relay terminal externally outputting the drive signal to still another external device in parallel while applying the drive signal to the other external device on which the relay substrate is mounted, and
wherein, in a state where the relay substrate is mounted on each of a first external device and a second external device, which are the other external devices, the parallel drive terminal is connected, by a wiring line, to the relay terminal of the relay substrate mounted on the first external device, and the relay terminals of the first external device and the second external device are connected to each other by a wiring line,
the driver circuit driving the first external device and the second external device in parallel by using the drive signal that the driver circuit externally outputs from the parallel drive terminal.

8. The driver circuit device according to claim 6,
wherein the insulating surrounding member and the insulating partition member are integrated, with a peripheral edge of the partition member coupled with the surrounding member.

9. The driver circuit device according to claim 8, further comprising:
a parallel drive terminal that is disposed on the circuit board and externally outputting the drive signal in parallel to another external device disposed in addition to the external device on which the driver circuit device is mounted,
wherein, in a state where a relay substrate having a circuit which applies, to the other external device, the drive signal input through a predetermined relay terminal is mounted on the other external device, the driver circuit driving the other external device in parallel by using the drive signal that the driver circuit externally outputs from the parallel drive terminal to the relay terminal through a wiring line.

10. The driver circuit device according to claim 9,
wherein another relay terminal is disposed on the relay substrate, the other relay terminal externally outputting the drive signal to still another external device in parallel while applying the drive signal to the other external device on which the relay substrate is mounted, and
wherein, in a state where the relay substrate is mounted on each of a first external device and a second external device, which are the other external devices, the parallel drive terminal is connected, by a wiring line, to the relay terminal of the relay substrate mounted on the first external device, and the relay terminals of the first external device and the second external device are connected to each other by a wiring line,
the driver circuit driving the first external device and the second external device in parallel by using the drive signal that the driver circuit externally outputs from the parallel drive terminal.

\* \* \* \* \*